(12) United States Patent
Elden

(10) Patent No.: US 8,851,898 B2
(45) Date of Patent: Oct. 7, 2014

(54) MANIKIN WITH COOLING PLATE

(75) Inventor: Tor Elden, Sandnes (NO)

(73) Assignee: Laerdal Medical AS, Stavanger (NO)

( * ) Notice: Subject to any disclaimer, the term of this patent is extended or adjusted under 35 U.S.C. 154(b) by 680 days.

(21) Appl. No.: 12/810,039

(22) PCT Filed: Jan. 9, 2009

(86) PCT No.: PCT/NO2009/000012
§ 371 (c)(1),
(2), (4) Date: Jun. 22, 2010

(87) PCT Pub. No.: WO2009/088305
PCT Pub. Date: Jul. 16, 2009

(65) Prior Publication Data
US 2010/0291523 A1    Nov. 18, 2010

Related U.S. Application Data

(60) Provisional application No. 61/006,439, filed on Jan. 14, 2008.

(30) Foreign Application Priority Data

Jan. 11, 2008    (NO) .................................... 20080200

(51) Int. Cl.
*G09B 23/28* (2006.01)
*H05K 7/20* (2006.01)
*G09B 23/30* (2006.01)
(52) U.S. Cl.
CPC ............ *G09B 23/30* (2013.01); *H05K 7/20509* (2013.01)
USPC ........................... 434/267; 434/262; 434/272

(58) Field of Classification Search
CPC .............................. G09B 23/28; G09B 23/281
USPC .......................................... 434/262, 267, 272
See application file for complete search history.

(56) References Cited

U.S. PATENT DOCUMENTS 2,772,664 A     12/1956  Jones
3,209,469 A  *  10/1965  James ........................... 434/265
(Continued)

FOREIGN PATENT DOCUMENTS

DE          3049583 A1      7/1982
EP          1057451 A2      12/2000
(Continued)

OTHER PUBLICATIONS

Toll, Anders/MRo, "International Search Report", for PCT/NO2009/000012 as mailed Apr. 2, 2009, 4 pages.
(Continued)

*Primary Examiner* — Sam Yao
*Assistant Examiner* — Alvin Carlos
(74) *Attorney, Agent, or Firm* — Winstead PC

(57) ABSTRACT

Manikin for the training of medical personnel and the like, comprising electrical circuitry for sensing of input parameters and controlling of output parameters. The manikin comprises a plate comprising metal, for the conduction of heat generated by said electrical circuitry, away from said circuitry. The said plate serves as a structural part, as it is connected, directly or indirectly, to at least one of the group consisting of thighs, pelvis, neck (head), and arms. Furthermore, the plate constitutes at least a part of a Faraday cage surrounding a manikin main board.

18 Claims, 6 Drawing Sheets

(56) References Cited

U.S. PATENT DOCUMENTS

| | | | |
|---|---|---|---|
| 3,520,071 A * | 7/1970 | Clark | 434/265 |
| 3,657,925 A | 4/1972 | Gross | |
| 3,736,362 A | 5/1973 | Laerdal | |
| RE29,317 E | 7/1977 | Mosley et al. | |
| 4,240,291 A | 12/1980 | Andersson et al. | |
| 4,430,893 A | 2/1984 | Barkalow | |
| 5,137,459 A * | 8/1992 | Zirm | 434/271 |
| 5,584,701 A * | 12/1996 | Lampotang et al. | 434/272 |
| 5,772,443 A | 6/1998 | Lampotang et al. | |
| 5,868,579 A * | 2/1999 | Lampotang et al. | 434/266 |
| 5,873,731 A | 2/1999 | Prendergast | |
| 5,941,710 A * | 8/1999 | Lampotang et al. | 434/272 |
| 6,269,003 B1 | 7/2001 | Wen-Chen | |
| 6,443,735 B1 | 9/2002 | Eggert et al. | |
| 6,503,087 B1 | 1/2003 | Eggert et al. | |
| 6,577,504 B1 * | 6/2003 | Lofland et al. | 361/709 |
| 6,626,236 B1 * | 9/2003 | Bandoh et al. | 165/206 |
| 7,480,992 B2 * | 1/2009 | Okamoto et al. | 29/890.054 |
| 2002/0153130 A1 * | 10/2002 | Okamoto et al. | 165/170 |
| 2003/0073060 A1 * | 4/2003 | Eggert et al. | 434/262 |
| 2004/0214150 A1 * | 10/2004 | Eggert et al. | 434/273 |
| 2008/0131855 A1 * | 6/2008 | Eggert et al. | 434/266 |
| 2008/0138780 A1 * | 6/2008 | Eggert et al. | 434/266 |
| 2009/0035740 A1 * | 2/2009 | Reed et al. | 434/265 |
| 2010/0291523 A1 * | 11/2010 | Elden | 434/267 |
| 2010/0304347 A1 * | 12/2010 | Eggert et al. | 434/266 |

FOREIGN PATENT DOCUMENTS

| | | |
|---|---|---|
| GB | 2191884 A | 12/1987 |
| GB | 2339323 A | 1/2000 |
| JP | 8190340 A | 7/1996 |
| WO | WO-01/62057 A1 | 8/2001 |
| WO | WO-2005/032327 A2 | 4/2005 |

OTHER PUBLICATIONS

Yasuhiro, M., et al., "Sensor-Equipped Dummy 'DAMIYAN'", Journal of Japan Society for Fuzzy Theory and Intelligent Informatics, vol. 18, No. 1, Feb. 2008, pp. 13-16.

* cited by examiner

MANIKIN WITH COOLING PLATE

CROSS-REFERENCE TO RELATED APPLICATIONS

This application is a U.S. national-stage filing of International Application No. PCT/NO2009/000012, filed on Jan. 9, 2009. PCT/NO2009/000012 claims priority from U.S. Provisional Patent Application No. 61/006,439, filed on Jan. 14, 2008. U.S. Provisional Patent Application No. 61/006,439 is incorporated herein by reference.

The present invention relates to a manikin for the training of medical practitioners and the like, comprising a means for dissipating heat generated by electrical and electromechanical devices inside the manikin. In particular, the invention relates to such a manikin comprising a cooling plate for said heat dissipation.

BACKGROUND

Training manikins comprising electronics for the control of output and input parameters have been known for some time. Such parameters can include the sensing of actions performed by the medical trainee, such as a heart compression, or the actuation of an output parameter, such as a sound production or trembling using electromechanical drives. As such manikins are continually developed with more electronics inside, the produced heat inside the manikin increases. This heat must be lead away from the electronic devices and out of the manikin in order to prevent overheating inside. An overheating will result in malfunction of various devices, such as a CPU (central processing unit) for the control of said parameters.

An obvious way to solve the problem would be to arrange a plurality of venting holes in the manikin, for leading the heat out of the manikin with through-flowing air. The heated air inside would then be substituted by fresh, colder external air. However, a manikin should provide a training experience as close as possible to real life scenario, and venting holes would not look and feel natural. In addition, through such holes, dirt and unwanted particles or organisms may enter the manikin. To ensure air exchange inside the manikin, a powerful fan may be needed, generating noise and additional heat production.

Another way would be to obviate the problem by moving as much as possible of the heat generating electronics and actuators outside the manikin. With a manikin as described in patent publication U.S. Pat. No. 5,772,443 (Lampotang), this could be a solution. Here, the manikin is placed on a bench with a multitude of instruments. However, with a manikin for use in a real life situation, not bound to a hospital or a particular training location, it is desirable that the manikin should be easily movable, without bringing along large amounts of connected equipment. The electronic devices and actuators should thus be arranged inside the manikin, not outside. This will also facilitate the set-up of a real life accident scenario, with an autonomous body (manikin) being arranged naturally at the scene of an accident, for instance.

Thus, by handling the heat generated by the electronic and electromechanical or other devices in a manikin, one avoids having to move devices outside of the manikin, while avoiding venting holes in the manikin skin. Of course, some devices will possibly be outside the manikin, such as a power supply or a communication interface, but the desired solution should not make it necessary to move any of the devices out of the manikin due to an overheating problem. Accordingly, the object of the present invention is to provide a manikin wherein such a solution is incorporated.

THE INVENTION

The said object is solved by a manikin according to the present invention. Such a manikin is a manikin for the training of medical personnel and the like, comprising electrical circuitry for sensing of input parameters and controlling of output parameters. It comprises a plate comprising metal, for the conduction of heat generated by said electrical circuitry, away from said circuitry. Furthermore, the plate serves as a structural part of the manikin, as it is connected, directly or indirectly, to at least one of the group consisting of thighs, pelvis, neck (head), and arms. In addition, the plate constitutes at least a part of a Faraday cage surrounding a manikin main board.

As will be appreciated from the discussion below, such a plate, or a cooling plate, has numerous advantages when used in a manikin of the above mentioned type.

Advantageously, the said cooling plate aluminum, giving the plate a high structural strength and heat conduction characteristics. In addition, aluminum is a light and cheap metal, and not exposed to deterioration due to corrosion.

By letting the plate serve as a substantial structural part, one obtains that the plate serves an additional purpose in addition to the cooling. Thus, the plate can constitute a central connection part of the manikin. For instance, a structural component of a manikin arm or leg/thigh may be connected directly to the plate. However, such a component could also be connected indirectly to the plate, through additional structure bridging the plate and the body part. For example, the plate can be connected to a pelvis component, which also is connected to the legs or thighs of the manikin.

According to an advantageous embodiment of the present invention, the cooling plate is arranged substantially parallel to an electrical main board in the manikin, for dissipation of heat generated by said main board. In this way, the heat conduction from the elements on the main board is efficiently provided to the cooling plate. To achieve even more efficient cooling of the elements on the main board, the plate is arranged for circulation of air from one side of the plate to the other, providing air flow over the said elements.

In a particularly advantageous embodiment, the plate comprises at least one aperture for the flow-through of cooling air. Preferably, a fan is arranged in association to the cooling plate, for providing air flow through at least one of said apertures. Also, the plate is arranged in such way that cooling air is flowing in a space between the plate and said main board, for directing the air flow over the elements on the main board.

For efficient cooling of a particularly heat generating or critical element, such as a CPU, the element can be arranged directly opposite an aperture in the cooling plate, for directed air flow over the said element. Another possible measure enhancing the cooling efficiency of such an element is to arrange a part of the cooling plate in thermal contact with said element.

Characteristic to an advantageous embodiment of the present invention, substantially all heat produced in the manikin is lead to the surroundings by heat conduction through the exterior parts of the manikin, such as imitated skin. In this way, unrealistic venting holes in the exterior parts of the manikin (skin) is avoided, resulting in a more authentic training experience for the trainee.

Having the cooling plate comprising metal and constituting a part of a Faraday cage surrounding a manikin main board, makes the cooling plate partly fulfilling yet another object. As the manikin main board holds electronic circuitry of many kinds, a Faraday cage should be arranged around it to comply with EMC regulations (electromagnetic compatibility). Such regulations may be particularly stringent, since the manikin should be allowed for use in hospitals where sensitive electronic equipment is used. When the cooling plate is adapted with one or more apertures for air flow, the apertures should preferably be covered with a metal grid for blocking electromagnetic waves, but letting air flow through freely.

In a particular embodiment, the manikin according to the present invention is provided with sensing means for sensing of the presence of listening apparatuses, such as a stethoscope. In addition, the fan is adapted to be switched off during the presence of such a listening apparatus. Since the fan may produce some noise when running, this feature ensures that the fan does not disturb a listening sequence.

Preferably, the cooling plate is arranged in the manikin torso and has a width of at least ½ of the width of the torso. Having such a large sized plate results in a wide spreading of the heat that shall be conducted out of the manikin, substantially through the skin. The wide spreading of the heat results in no exceptionally warm locations on the skin, and that the need for ventilating holes is avoided.

According to another preferable embodiment of the present invention, the cooling plate is arranged with a reception section for a heart compression resistance spring. Such a spring can be arranged in the manikin for providing resistance to the chest when it is pushed down as in a heart compression training drill. By incorporating this feature into the cooling plate, one avoids having a dedicated structural element for the same purpose.

In stead of having only one plate arranged in the manikin, one embodiment of the invention applies two or more plates. The plates may preferably have a thermal connection. They may for instance be hinged together with a heat conducting hinge joint.

As will be appreciated by the summarized description of the invention and the following example of embodiment according to the invention, the invention has numerous advantages:

- The effective cooling plate results in a minimum use of fan for cooling the heat generating components. Depending on the temperature of the surroundings, a fan may not have to be used at all. If use of a fan is necessary, the large size of the cooling plate and the effective set-up result in a minimum need for such use. As mentioned above, manikins of the described kind can be required to produce no or little noise, except for any desired or produced noise for medical training purposes.
- The cooling plate meets structural requirements.
- Due to the large size of the plate, the produced heat can be lead out by thermal conduction through the manikin skin. No venting apertures needed and no exceptionally warm locations on the skin surface will arise.
- The cooling plate can provide a strong structural reception section for a heart compression resistance spring, omitting a dedicated structure for this purpose.
- The cooling plate contributes in meeting electromagnetic compatibility (EMC) requirements, by constituting at least a part of a Faraday cage.

EXAMPLE

In the following, a detailed example of an embodiment of the present invention is given with reference to the drawings, in which FIG. 1 is a view of the torso section of a manikin according to the present invention;

Figure 1:
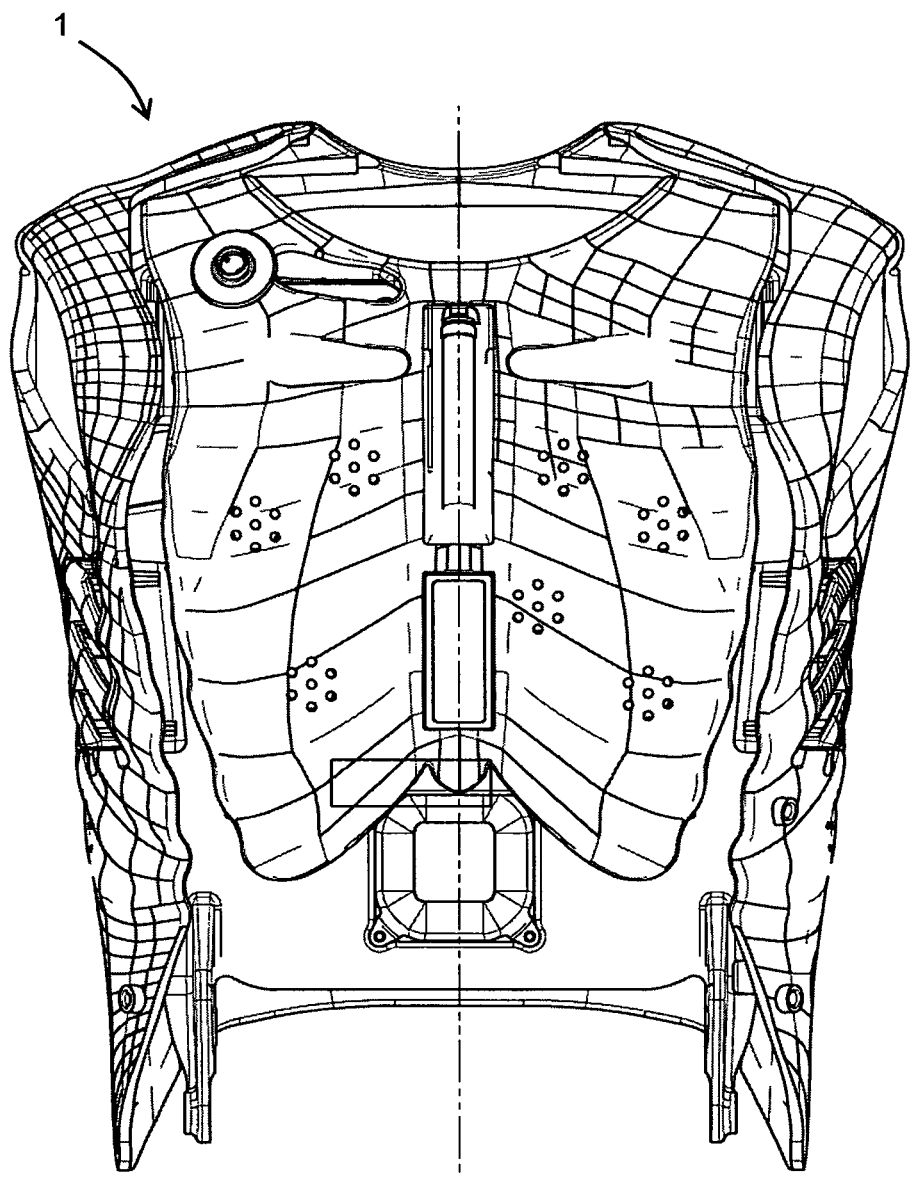
Figure 2:
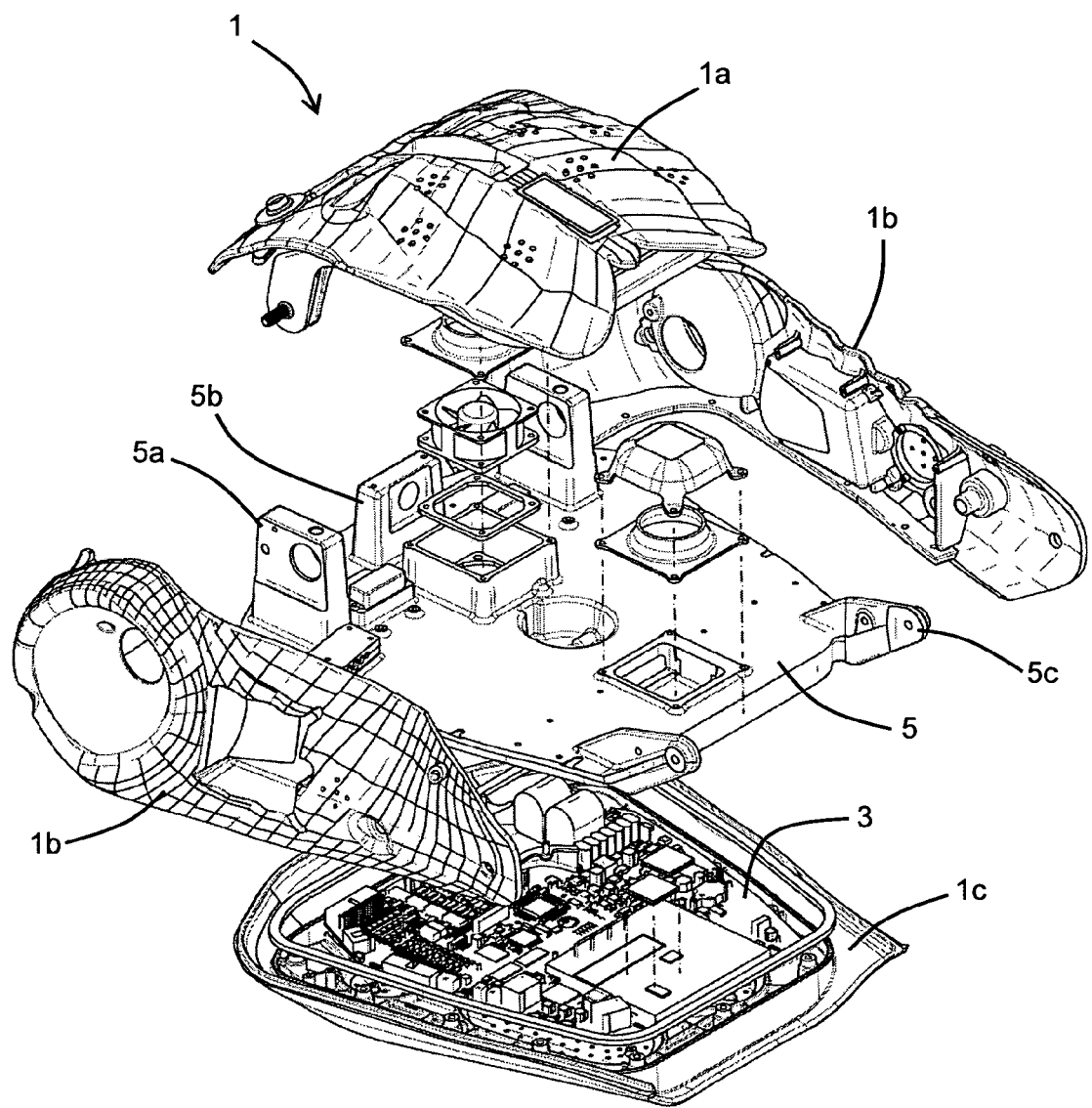
FIG. 2 is an exploded perspective view of the torso section of a manikin according to the present invention.

FIG. 1 illustrates the front part of the torso 1 of a manikin according to an embodiment of the present invention. As shown, the torso is comprised of a plurality of various components. In use, imitated skin (not shown) will cover the shown parts, giving the manikin a realistic look. FIG. 2 shows the same torso 1 in an exploded view, where more components can be seen. A top cover 1a (preferably compliant for resuscitation practice), side covers 1b and a bottom cover 1c constitute the outer parts of the torso 1, in addition to the imitated skin. The bottom cover 1c makes the back part of the torso. Substantially parallel to the bottom part 1c is a manikin main board 3 arranged. The main board 3 includes various electrical devices for the control of various manikin features. The main board 3 will be further described with reference to FIG. 5.

A cooling plate 5 is arranged adjacent and over the main board 3. In this embodiment, the cooling plate 5 is made of aluminum, giving a light weight, yet structural robustness and high thermal conductivity. The cooling plate 5 comprises attachment flanges 5a for the attachment of the manikin arms (not shown), a head (neck) attachment flange 5b and pelvis attachment flanges 5c. In stead of the pelvis attachment flanges 5c, one could also imagine a longer cooling plate 5 with thigh attachment flanges (not shown), or even one or more plates (or other elements) between the cooling plate 5 and thigh connections.

Figure 3:
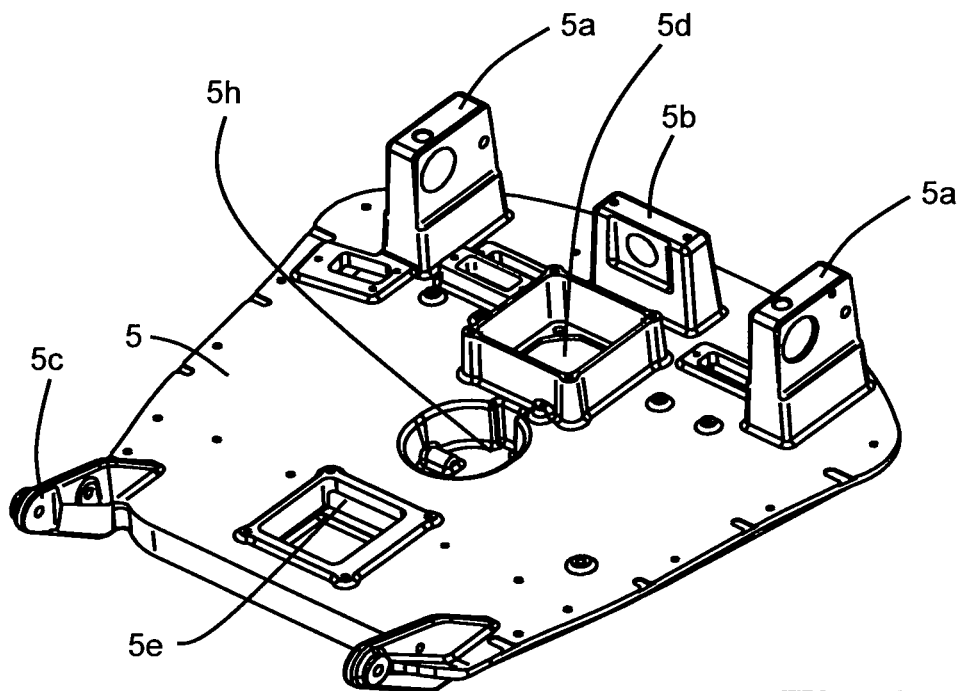
FIG. 3 is a perspective view of a cooling plate arranged in a manikin according to an embodiment of the present invention.
Figure 4:
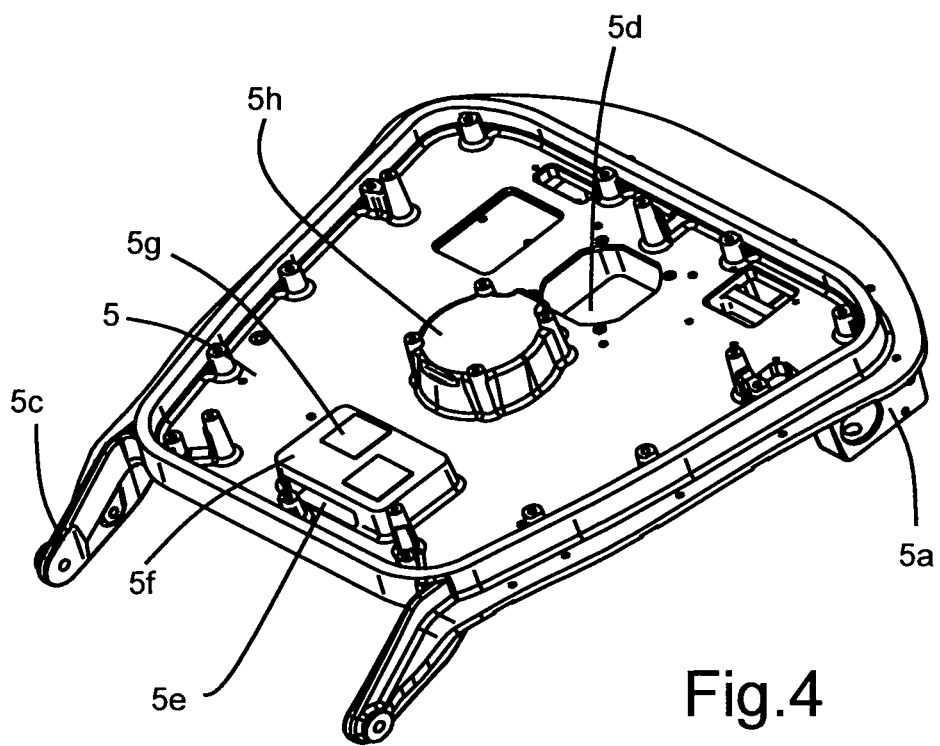
FIG. 4 is a perspective view of the cooling plate of FIG. 3, seen from a different angle.

FIGS. 3 and 4 show the upper and lower side of the cooling plate 5, respectively. With a distance from the plate perimeter there are two apertures 5d and 5e, for the through-flow of cooling air. In connection with the aperture 5e is a particular cooling section 5f of the cooling plate 5. The cooling section 5f is thermally coupled to a heat generating CPU through a flexible thermal conductor 5g. The CPU has a particular cooling requirement. This will be described in more detail further below.

Centrally arranged in the plate 5 is a spring reception section in the form of a recess 5h for reception of a heart compression spring (not shown). The spring is used to provide flexible resistance to the chest for heart compression practice. Without the plate 5, a dedicated structure with the mechanical strength for the reception of the spring would have to be provided. Thus, with the cooling plate 5, such an additional structure is advantageously avoided. With a good thermal connection between the cooling plate 5 and the spring, the spring could also conduct heat away from the plate 5. The cooling plate can preferably be a molded aluminum plate.

It should be noted that instead of having one single cooling plate, more plates could also be used in the same way. The plurality of plates could preferably be thermally connected. They could for instance be hinged together.

Figure 5:
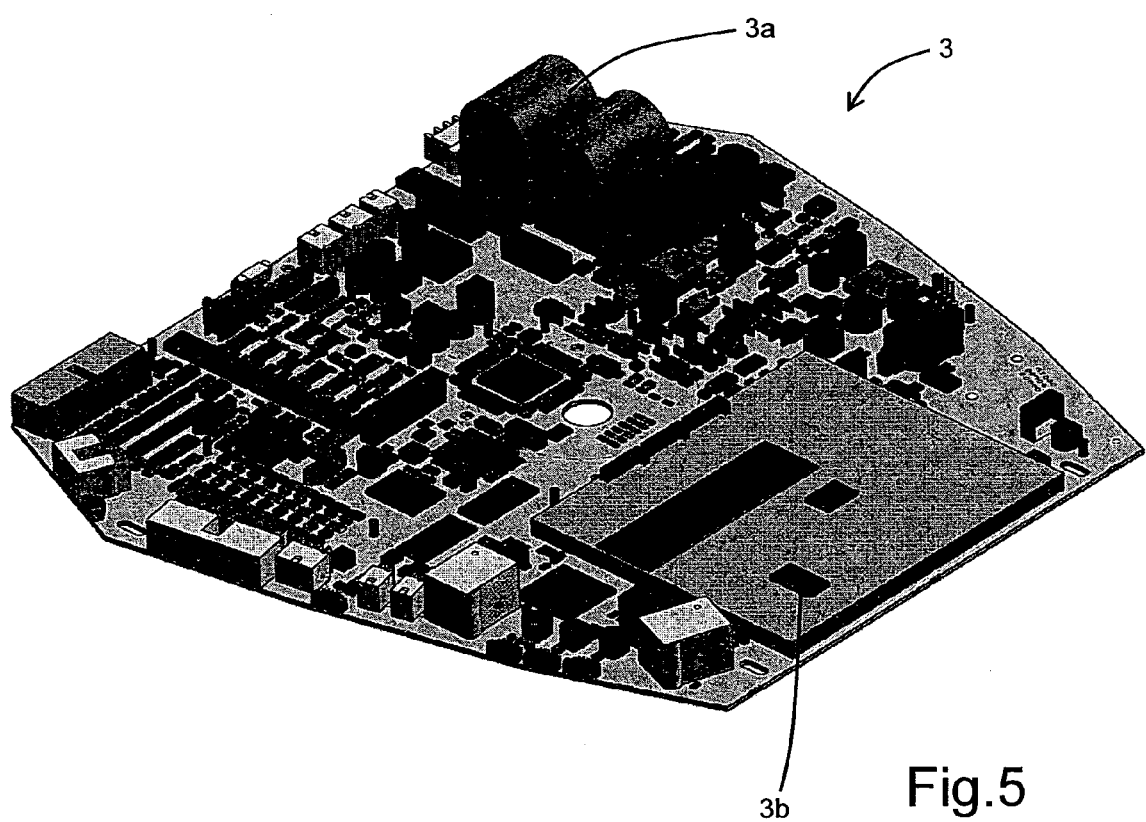
FIG. 5 is a perspective view of a main electrical circuit board, adapted to be arranged inside the torso.

FIG. 5 illustrates the manikin main board 3 shown in FIG. 2 in further detail. The perimeter of the main board 3 is adapted to be fitted in the manikin torso 1. Situating the main board 3 in the back of the manikin torso 1 is advantageous as this renders a large main board feasible. Of course, one could also arrange a plurality of circuit boards, but this would be unnecessary cumbersome and expensive. Close to one corner of the main board 3 there are arranged two large resistors 3a for the dissipation of the electrical energy received from a defibrillator (not shown). Thus, with the use of these resistors 3a, the energy from a defibrillator is dissipated in a controlled manner, and the nearby arranged cooling plate 5 will spread the generated heat throughout the torso 1. In this embodiment, the use of a defibrillator will result in a periodic effect of 12 W dissipated in the resistors 3a. Under normal operation, this main board 3 will dissipate about 12 W.

Preferably, many of the most heat-generating components are arranged in the same area on the main board 3. One would think such an arrangement is a drawback, as the elements will heat each other. However, this configuration renders it possible to direct the air flow from a fan 11 (FIG. 6) directly onto the warmest components.

Figure 6:
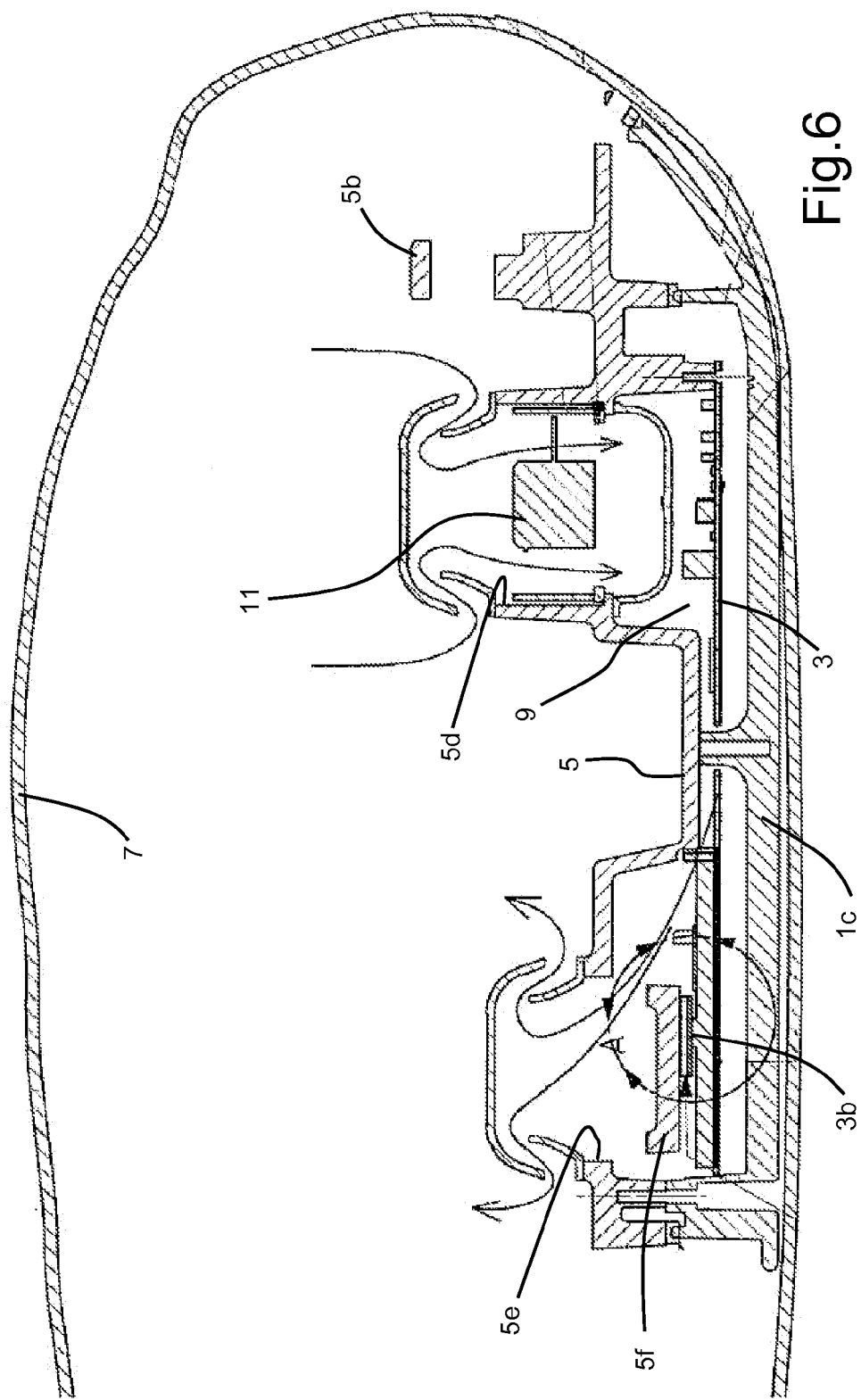
FIG. 6 is a cross section view through the torso, showing the cooling plate and cooling air flowing over some heat generating electric devices.

FIG. 6 is a cross section view showing the arrangement of the cooling plate 5 with respect to the manikin main board 3 and the bottom cover 1c. For simplicity, the top cover shown in FIG. 2 is omitted in this figure. A layer of imitated skin 7 is arranged around the covers 1a, 1b, 1c of the torso 1, substantially entrapping the air inside.

The main board 3 is arranged between the cooling plate 5 and the bottom cover 1c. As can be appreciated from FIG. 6, a space 9 is confined between the main board 3 and the cooling plate 5. The air in this space 9 is thus heated by the various electric elements on the main board 3. This heat is then transferred to the cooling plate 5. In addition, as briefly mentioned above, the cooling plate 5 is provided with two apertures 5d and 5e. A small fan 11 is arranged in the aperture 5d to provide a flow of air into the space 9 through the aperture 5d. The air thus flows from the air space in the torso 1, into the space 9 between the main board 3 and the cooling plate 5, and finally out back through aperture 5d as heated air. Thus, (relatively) cool air is drawn into the space 9 and flowed past heat generating electric elements which then are cooled. It should be noted that this is a closed loop. Air is not drawn from outside of the manikin, but from the space inside it. The air is thus heated in the space 9 between the cooling plate 5 and the main board 3, and cooled off outside this space 9, by transferring heat to the exterior parts of the manikin, such as the skin 7. The heat is conducted out of the manikin through the skin 7.

The fan 11 is advantageously controlled in order to provide air flow through the space 9 when necessary. During some training scenarios using a manikin according to the invention, the trainee will listen for body sounds, such as heart sounds or lunge sounds. In some cases, the fan 11 may produce a disturbing sound. Therefore, in an embodiment according to the invention, the manikin comprises sensors for sensing the presence of medical listening apparatuses, such as a stethoscope. When sensing such presence, the control of the fan 11 is adapted to stop the fan 11 for a short period of time, in order to avoid disturbing such a listening action. However, the temperature of critical electrical elements should preferably be monitored in order to start the fan 11 before any critical temperatures are reached.

Figure 7:
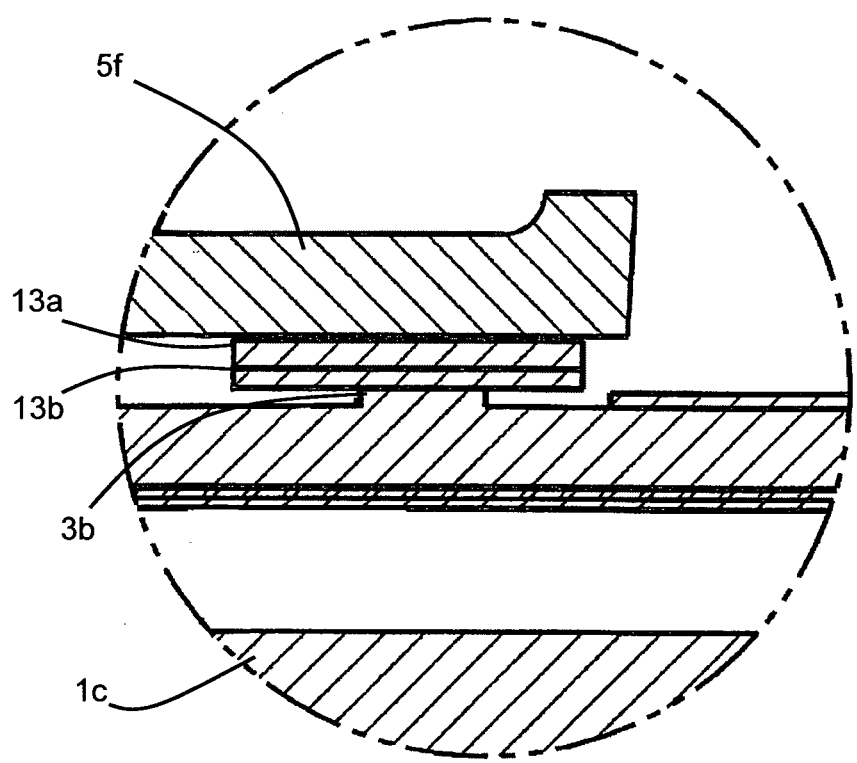
FIG. 7 is an enlarged cross section view showing a particular set-up for the cooling of a CPU.

In an especially advantageous embodiment, as shown in FIG. 6, the cooling plate has a particular cooling section 5f that is arranged directly adjacent a main board CPU 3b (central processing unit). As perhaps best shown in FIGS. 3 and 4, the cooling section 5f is a plate section with a lower elevation than the opening of the aperture 5e, with the air flowing laterally over the cooling section 5f. Thus, the cooling section 5f is cooled particularly efficiently. As shown in further detail in FIG. 7, the cooling section 5f is in thermal contact with the CPU 3b through a flexible thermal conductor 13a and an aluminum plate 13b. This direct thermal contact between the cooling plate 5 and the CPU 3b provides for an efficient removal of the heat generated by the CPU 3b.

In a preferable embodiment of the present invention, the cooling plate 5 constitutes part of a Faraday cage that surrounds the main board 3. As briefly mentioned above, there may be stringent EMC-requirements (electromagnetic compatibility) for a manikin of the type according to the invention. A Faraday cage is an efficient means to ensure such compatibility. Having the cooling plate 5 made of metal, such as aluminum, it can be part of such a Faraday cage, thereby fulfilling yet another purpose. Of course, the Faraday cage must be completed, preferably by the bottom cover 1c, in order to encapsulate the main board 3 completely.

Preferably, the size of the cooling plate is at least ½ of the width of the torso. By arranging a cooling plate with a large area, efficient heat transmission from the plate 5 to the air in the torso 1 is provided. Also, the large area ensures an even distribution of the heat inside the torso, making the torso skin more or less equally warm at all areas. Particular locations that are exceptionally warm will result in an unrealistic experience for the trainee.

The invention claimed is:

1. A manikin comprising:
    a heat-conductive air-impermeable body surrounding a cavity;
    electrical circuitry disposed in the cavity, the electrical circuitry sensing input parameters and controlling output parameters; and
    a Faraday cage proximate to the electrical circuitry, the Faraday cage comprising a plate thermally exposed to the electrical circuitry and interoperably coupled to at least one of a thigh, a pelvis, a neck, a head, and an arm, the plate comprising metal that conducts heat generated by the electrical circuitry away from the electrical circuitry.

2. The manikin according to claim 1, wherein the plate is arranged parallel to a main board disposed in the manikin for dissipation of heat generated by the main board.

3. The manikin according to claim 1, wherein the plate is arranged for circulation of air from one side of the plate to another side of the plate.

4. The manikin according to claim 1, wherein the plate comprises at least one aperture for flow-through of cooling air.

5. The manikin according to claim 4, wherein a fan is arranged in association to the plate for providing air flow through the at least one aperture.

6. The manikin according to claim 3, wherein the plate is arranged in such way that cooling air flows in a space between the plate and the main board.

7. The manikin according to claim 4, comprising:
    an element on the main board, wherein the element generates heat, and an aperture in the plate is arranged in corresponding locations, so that cooling air is flown directly on the element.

8. The manikin according to claim 1, wherein the plate is in thermal contact with heat generating circuitry.

9. The manikin according to claim 1, wherein all heat produced in the manikin is lead to the surroundings by heat conduction through exterior parts of the manikin, wherein exterior parts of the manikin comprise imitated skin.

10. The manikin according to claim 4, wherein the at least one aperture is covered with a metal grid, the metal grid constitutes part of the Faraday cage through which air can flow freely.

11. The manikin according to claim 5, wherein:
the manikin is provided with sensing means for sensing presence of listening apparatuses; and
wherein the fan is operable to be switched off during presence of the listening apparatus.

12. The manikin according to claim 1, wherein the plate is arranged in a torso region of the manikin and has a width of at least ½ of a width of the torso region.

13. The manikin according to claim 1, wherein the plate is arranged with a reception section for a heart compression resistance spring.

14. The manikin according to claim 1, wherein the said plate is one of a plurality of cooling plates.

15. The manikin according to claim 14, wherein at least two of the plurality of cooling plates are thermally connected.

16. The manikin of claim 13, wherein the heart compression resistance spring facilitates conductive transfer of heat from the plate.

17. The manikin of claim 1, wherein a flexible thermal conductor is disposed between the plate and at least a portion of the electrical circuitry.

18. The manikin of claim 17, wherein a second aluminum plate is disposed between the plate and at least a portion of the electrical circuitry.

* * * * *

UNITED STATES PATENT AND TRADEMARK OFFICE
CERTIFICATE OF CORRECTION

| | | |
|---|---|---|
| PATENT NO. | : 8,851,898 B2 | Page 1 of 1 |
| APPLICATION NO. | : 12/810039 | |
| DATED | : October 7, 2014 | |
| INVENTOR(S) | : Tor Elden | |

It is certified that error appears in the above-identified patent and that said Letters Patent is hereby corrected as shown below:

In the Claims

Column 7, Claim 14, Lines 18-19   Replace "wherein the said plate" with
-- wherein the plate --

Signed and Sealed this
Tenth Day of February, 2015

Michelle K. Lee
*Deputy Director of the United States Patent and Trademark Office*